(12) United States Patent
Luich et al.

(10) Patent No.: US 7,545,665 B2
(45) Date of Patent: Jun. 9, 2009

(54) HIGH YIELDING, VOLTAGE, TEMPERATURE, AND PROCESS INSENSITIVE LATERAL POLY FUSE MEMORY

(75) Inventors: Thomas M. Luich, Puyallup, WA (US); David A. Byrd, Puyallup, WA (US)

(73) Assignee: Glacier Microelectronics, Inc., Santa Clara, CA (US)

(*) Notice: Subject to any disclaimer, the term of this patent is extended or adjusted under 35 U.S.C. 154(b) by 290 days.

(21) Appl. No.: 11/516,915

(22) Filed: Sep. 6, 2006

(65) Prior Publication Data

US 2008/0055959 A1 Mar. 6, 2008

(51) Int. Cl.
*G11C 17/00* (2006.01)
(52) U.S. Cl. .................. 365/96; 365/189.09; 365/225.7; 327/525
(58) Field of Classification Search .............. 365/96 O, 365/189.09 X, 210, 225.7 X, 96, 189.09, 365/225.7; 327/525
See application file for complete search history.

(56) References Cited

U.S. PATENT DOCUMENTS

| 6,072,732 A * | 6/2000 | McClure ..................... 365/191 |
| 7,158,435 B2 * | 1/2007 | Kobayashi et al. ........ 365/225.7 |
| 7,295,057 B2 * | 11/2007 | Bhushan et al. ............. 327/525 |

* cited by examiner

*Primary Examiner*—VanThu Nguyen (57) ABSTRACT

The present invention, generally speaking, provides for a non volatile memory cell requiring no extra process steps. In one embodiment, the non volatile memory cell is a lateral polysilicon programmable read only memory cell, in particular a lateral poly fuse memory cell. Technique are provided to achieve a high yielding, voltage, temperature, and process insensitive lateral poly fuse memory. In one embodiment, a fusible link memory circuit includes a fusible link memory element and a programming circuit. The programming circuit includes a replica of the fusible link memory element and a programming current source for producing a known current density in the fusible link memory element in spite of variations including at least process variations.

14 Claims, 7 Drawing Sheets

Constant Current Density Program Circuit

FIG. 1

Peak Fusing Current & Current Desity Vs. Fuse Width For .25u CMOS Process
Fuse L=1u, Programmed with 4145

FIG. 2

Fusing Current Vs. Fuse Width & Technology
L=1u, red dashed=interpolated trend line

FIG. 3

FIG. 4
Program/Read Circuit

Basic Constant Current Density Program Circuit

FIG. 7

FIG. 8
Simplified Constant Current Density Program Circuit

FIG. 9
Constant Current Density Program Circuit

HIGH YIELDING, VOLTAGE, TEMPERATURE, AND PROCESS INSENSITIVE LATERAL POLY FUSE MEMORY

BACKGROUND OF THE INVENTION

1. Field of the Invention

The present invention relates to fusible link memories, more particularly to lateral polysilicon programmable read only memories.

2. State of the Art

Programmable Read Only Memories (PROMs) have their roots in early bipolar technologies using various metal films as the programmable element (fuse). These early PROMs used the inherent high current characteristics of bipolar transistors to deliver sufficient current in the metal fuse such that metal migration would occur, causing an open circuit in the fuse. These metal fuses typically required extra masks and process steps to achieve thin cross sections in order to minimize the amount of current to open the fuse.

The destructive fuse eventually was replaced with non-destructive, CMOS, electrically erasable elements that could be programmed multiple times, with essentially no yield loss. EEPROMS are PROMs using electrically eraseable (EE) cells. Although EEPROMS are very high yielding, they typically require several extra mask and process steps to manufacture, adding significantly to the final cost of a basic logic process flow. EEPROMs therefore are manufactured as high yielding, high density products requiring dedicated process flows and fabrication facilities.

There are a number of applications where only a small number of bits of non volatile memory would be beneficial. These benefits can be offset, however, by the large cost of adding an expensive memory flow to the technology being used. It would therefore be beneficial to construct a non volatile memory cell requiring no extra process steps.

SUMMARY OF THE INVENTION

The present invention, generally speaking, provides for a non volatile memory cell requiring no extra process steps. In one embodiment, the non volatile memory cell is a lateral polysilicon programmable read only memory cell, in particular a lateral poly fuse memory cell. Technique are provided to achieve a high yielding, voltage, temperature, and process insensitive lateral poly fuse memory. In one embodiment, a fusible link memory circuit includes a fusible link memory element and a programming circuit. The programming circuit includes a replica of the fusible link memory element and a programming current source for producing a known current density in the fusible link memory element in spite of variations including at least process variations.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
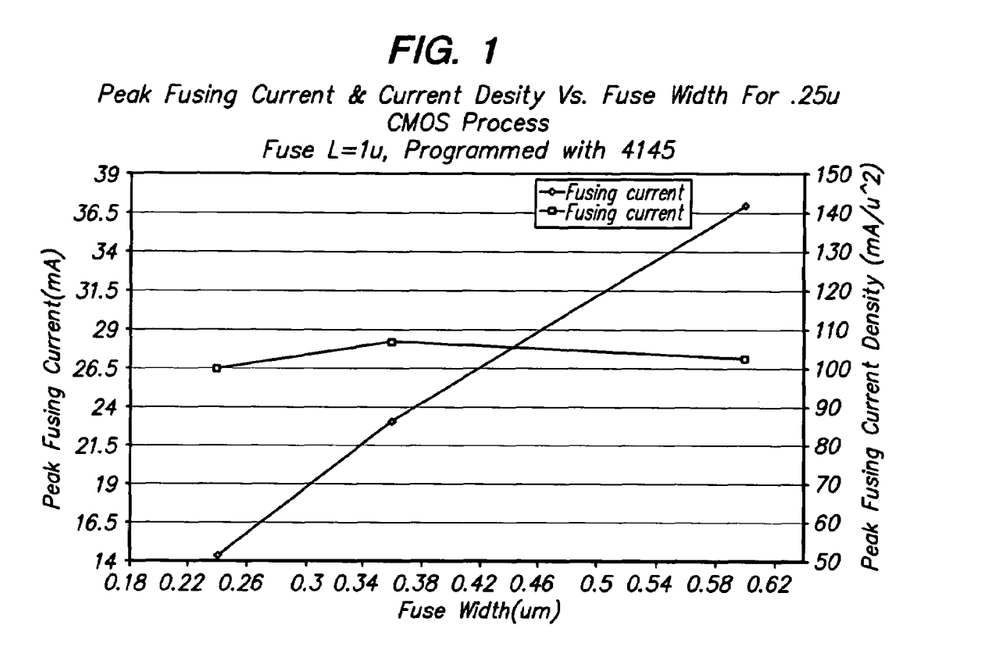
FIG. 1 is a graph of peak fusing current density versus fuse width for a 0.25 u CMOS process.

Through advanced lithography, standard CMOS technology has achieved cross sectional areas in polysilicon similar to the thin metal fuses of the early PROMs, suggesting that reasonable programming currents could be achieved. FIG. 1 shows the peak fusing current and peak fusing current density measured on a polysilicon fuse link for three different widths. The fuse length is 1 u, and the fuses are programmed using an HP4145 to ramp voltage and record current into the fuse.

It can be seen in FIG. 1 that the current required to blow the poly fuse is manageable, and that as the fuse width increases, the required fusing current increases proportionally.

Figure 2:
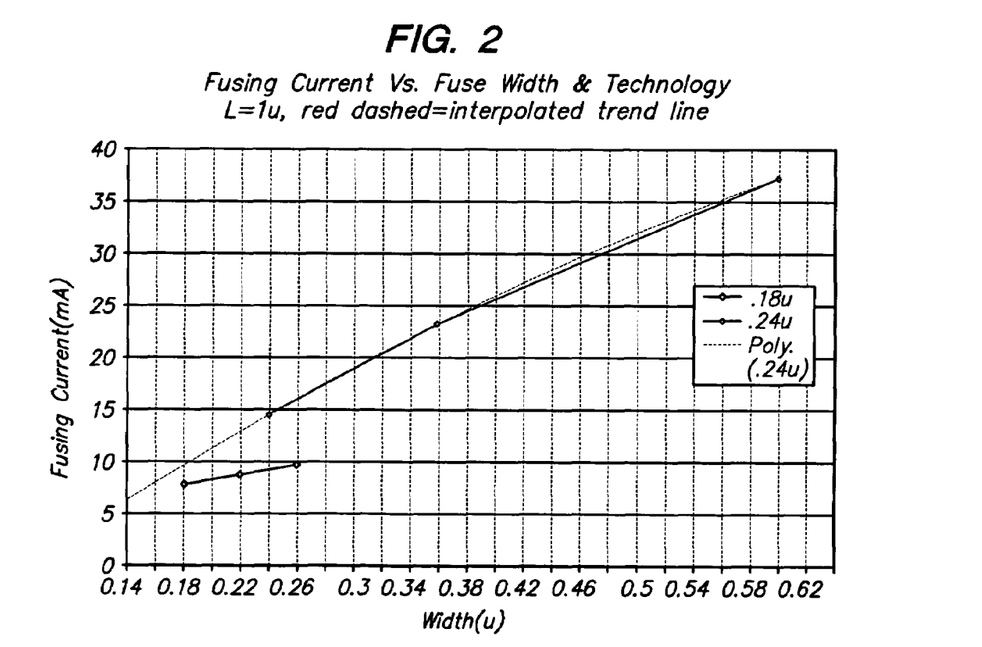
FIG. 2 is a graph of fusing current versus fuse width for different process technologies.

FIG. 1 suggests that the poly fuse can scale with technology. That is, as the fuse width narrows, the fusing current will decrease proportionally. FIG. 2 shows fusing current for varying width poly fuses in 0.25 u and 0.18 u technologies. The 0.25 u technology is interpolated down to 0.14 u width, and shows a close prediction for 0.18 u technology. Note that this interpolation does not account for the thinner poly line present in the 0.18 u technology, which explains the small difference in actual versus predicted fusing currents.

Figure 3:
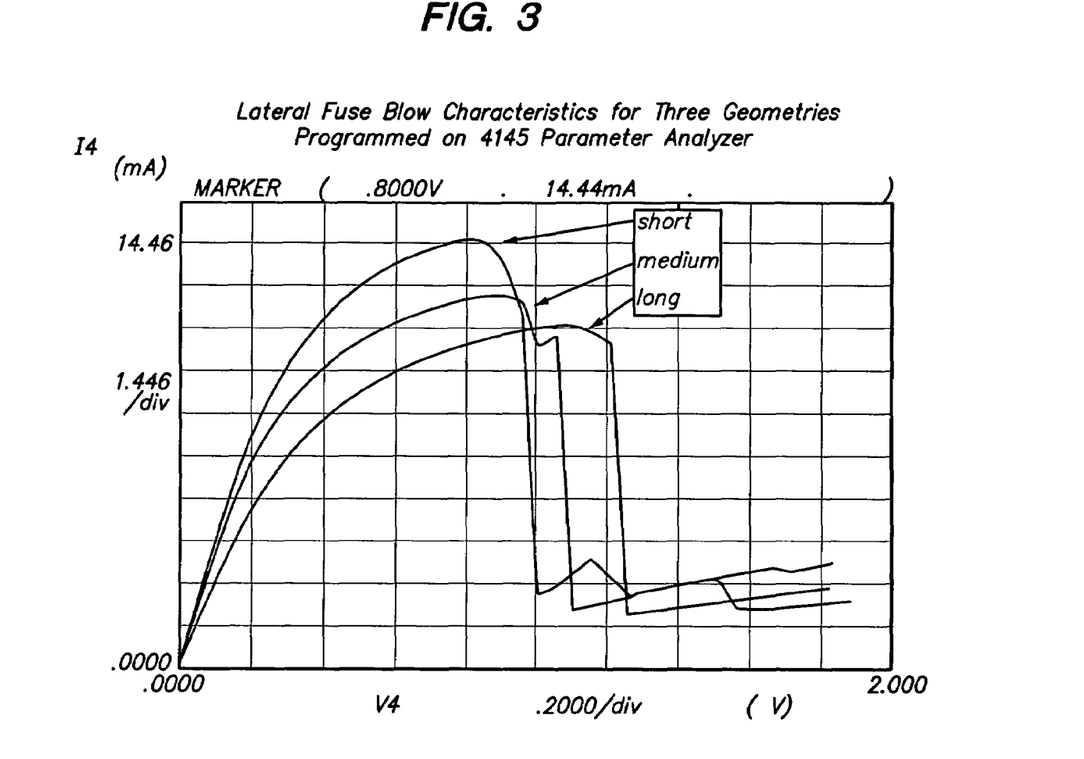
FIG. 3 is graph illustrating lateral fuse blow characteristics for different geometries.

The programming current is also affected by the fuse length, as show in the IV sweeps of FIG. 3.

Figure 4:
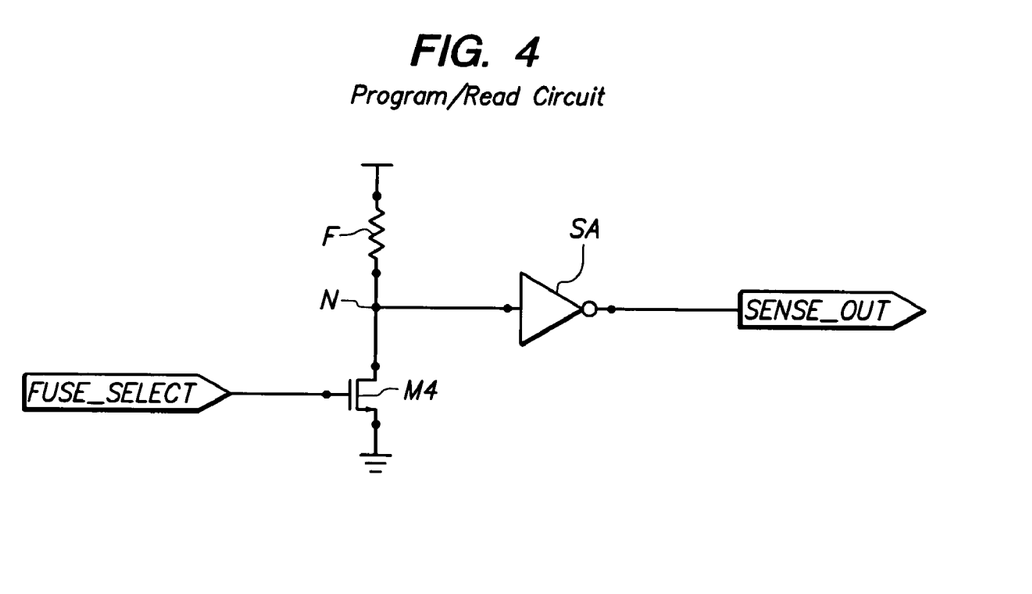
FIG. 4 is a diagram of a program/read circuit for a fusible link memory element.

FIG. 4 shows a fuse interface circuit, comprised of a fuse F, a fusing driver M4 and a sense circuit SA. One end of the fuse F is connected to a supply voltage VDD. An opposite end of the fuse is connected through the driver transistor M4 to ground. A FUSE_SELECT signal is connected to the gate of the driver M4; when it is asserted, the driver is turned on and a programming current is caused to flow through the fuse F. A sense amplifier SA is connected to a circuit node N between the fuse F and the driver M. The sense amplifier SA produces a signal SENSE_OUT. The sense amp contains a current source, or other mechanism to pull node N down when the fuse has been blown. FIGS. 1-3 demonstrate that the fusing driver must sink relatively large currents to program the fuse, and an NMOS driver delivers the fusing current with the least die area. The sense circuit determines whether or not the fuse has been programmed, in which state the fuse typically exhibits a resistance greater than 1 MegOhm. The fuse is typically around 50 ohms in the unprogrammed state.

Figure 5:
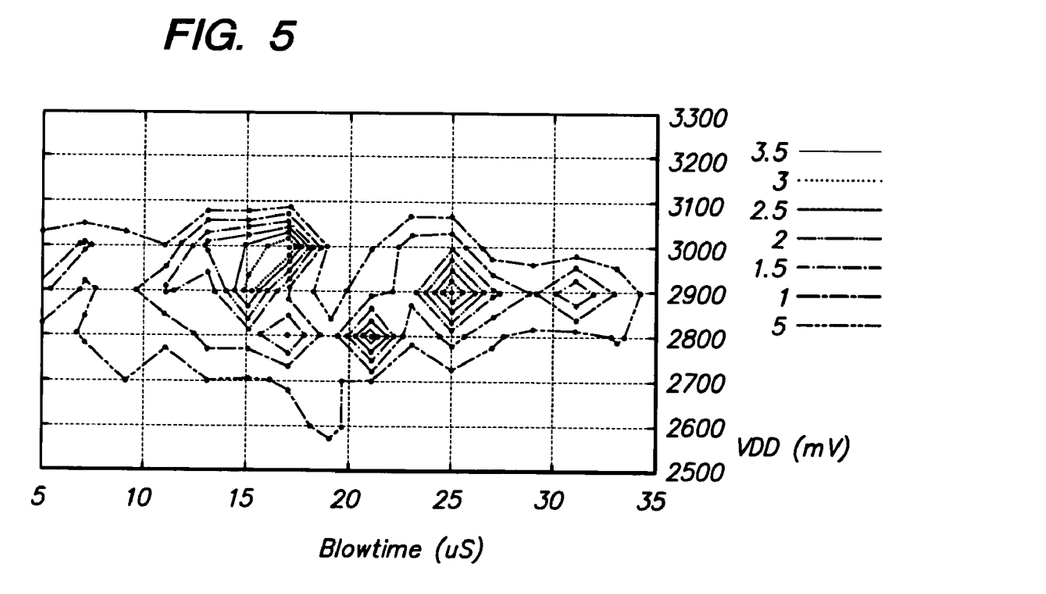
FIG. 5 is a graph illustrating programming yield contours.

Data from FIGS. 1-3 is derived from individual fuses swept in an IV fashion with DC test equipment. In a practical implementation, time is another variable that determines successful programming. FIG. 5 shows relative programming yield contours vs. VDD and programming time, using the circuit of FIG. 4. The higher the contour number the lower the predicted bit failures at programming, with any number greater than 0.5 graded as passing. Each data point in the plot is the aggregate of 1000 fuses blown.

The plot of FIG. 5 shows that: a. Programming yield is relatively insensitive to time or energy over the range of time observed; and b. Programming yield is strongly sensitive to VDD, indicating sensitivity to power or current.

The VDD variability is attributed to the variation in NMOS current since the gate of the driver (shown in FIG. 4) is held at VDD. The best region of operation, however, occurs over a narrow range of VDD. As the voltage across the fuse during programming is small with this variation, the yield sensitivity is attributed to variation in fusing current, not power.

The extremes of these contours define the limits of the high yielding region of operation during fusing. The VDD limits can be translated by the transconductance Gm of the NMOS driver to give the minimum and maximum fusing current that will achieve very high programming yield.

As seen in FIGS. 1 and 2, for varying fuse geometries examined, there is a constant fusing current density required to program the fuse. This fusing current density is determined by the physical properties of the fuse such as type of material, dimensions of the fuse, location of contacts, etc. This current density is observed to be roughly constant from one process technology to the next as long as dimensions are similar or scaled, and materials are equivalent. These results are consistent with earlier style metal fuses where a minimum current density was required for successful programming.

FIGS. 1-3 and 5 indicates that for a given process technology and fuse geometry, there is a narrow but optimum range of fusing current density that will allow the fuse to program at very high yields. Further, as long as the fusing current density is held within that range, the fuse may vary in critical dimensions due to process variations with no impact to yield.

It is desirable to keep the fusing current density within the limits defined in the foregoing figures over the various operating and manufacturing conditions of the memory.

Figure 6A:
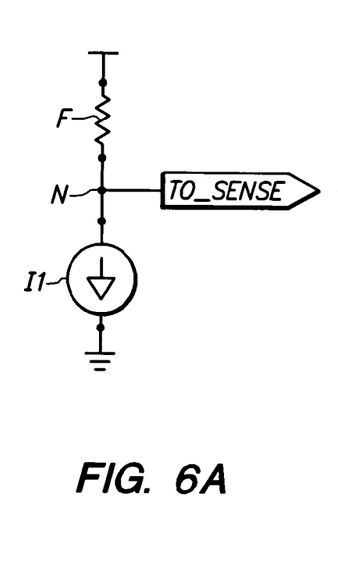
FIG. 6(A) is a diagram of a first basic constant current density programming circuit.
Figure 6B:
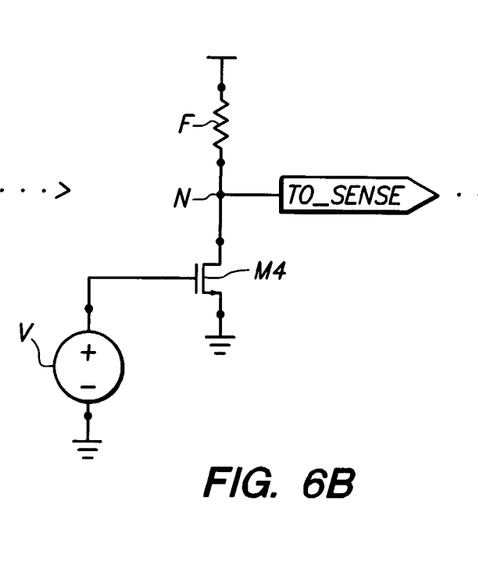
FIG. 6(B) is a diagram of a second basic constant current density programming circuit.

To maintain constant current density in the fuse, it is necessary to have a current source that tracks the fuse variations. That is if the fuse is under-etched resulting in a wider fuse, the current source must increase its current in a proportional manner. Referring to FIG. 6(A), one end of the fuse F is connected to a supply voltage VDD. An opposite end of the fuse is connected through a programming current source I1 to ground. The current source I1 shown in FIG. 6(A) can be replaced with a gate regulated NMOS transistor M4 shown in FIG. 6(B). A regulated voltage source V tracks the fuse characteristics as well as remove any VDD, temperature or NMOS device variation.

Figure 6C:
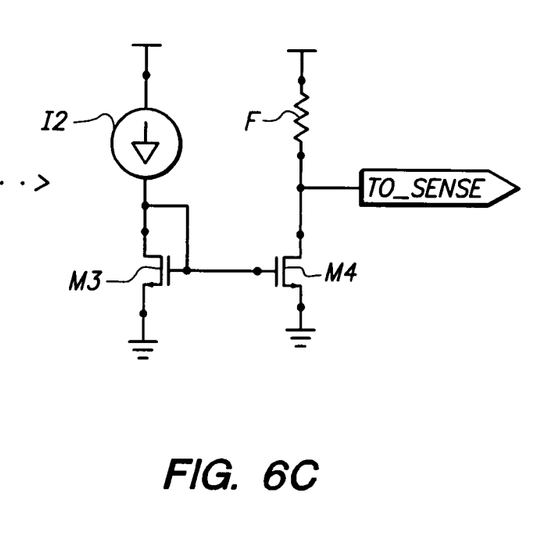
FIG. 6(C) is a diagram of a third basic constant current density programming circuit.

Alternatively, the NMOS, temperature, and VDD variations can be removed by using a current mirror arrangement as shown in FIG. 6(C). A fuse tracking fusing current source 12 is connected to the supply voltage VDD and is connected through a reference transistor M3 to ground. Gate electrodes of the transistors M3 and M4 are connected to the drain electrode of the transistor M3 to form a current mirror between transistors M3 and M4.

Figure 7:
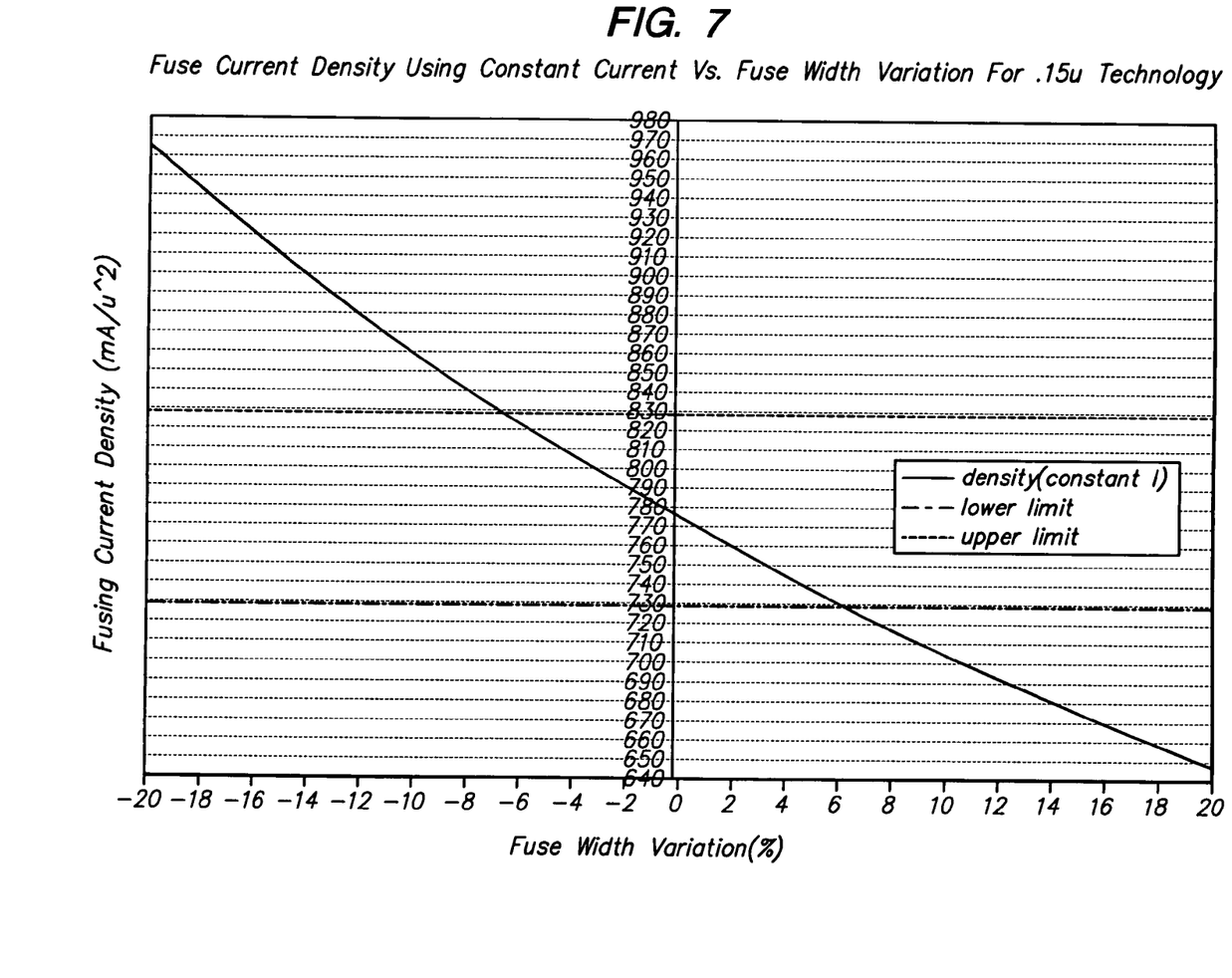
FIG. 7 is a graph of fuse current density using constant current versus fuse width variation for a 0.15 u process.

A constant current source can be created by placing a resistor across a constant voltage. If a constant current source is used to generate the fusing current, the fusing current density can vary with process variables such as poly etch. FIG. 7 shows the fusing current density as a function of poly width variation of −20% to +20% for a given fuse geometry on a 0.15 u technology. The upper and lower limits of acceptable current density, as determined experimentally in FIG. 5, are shown on the sweep.

Figure 8:
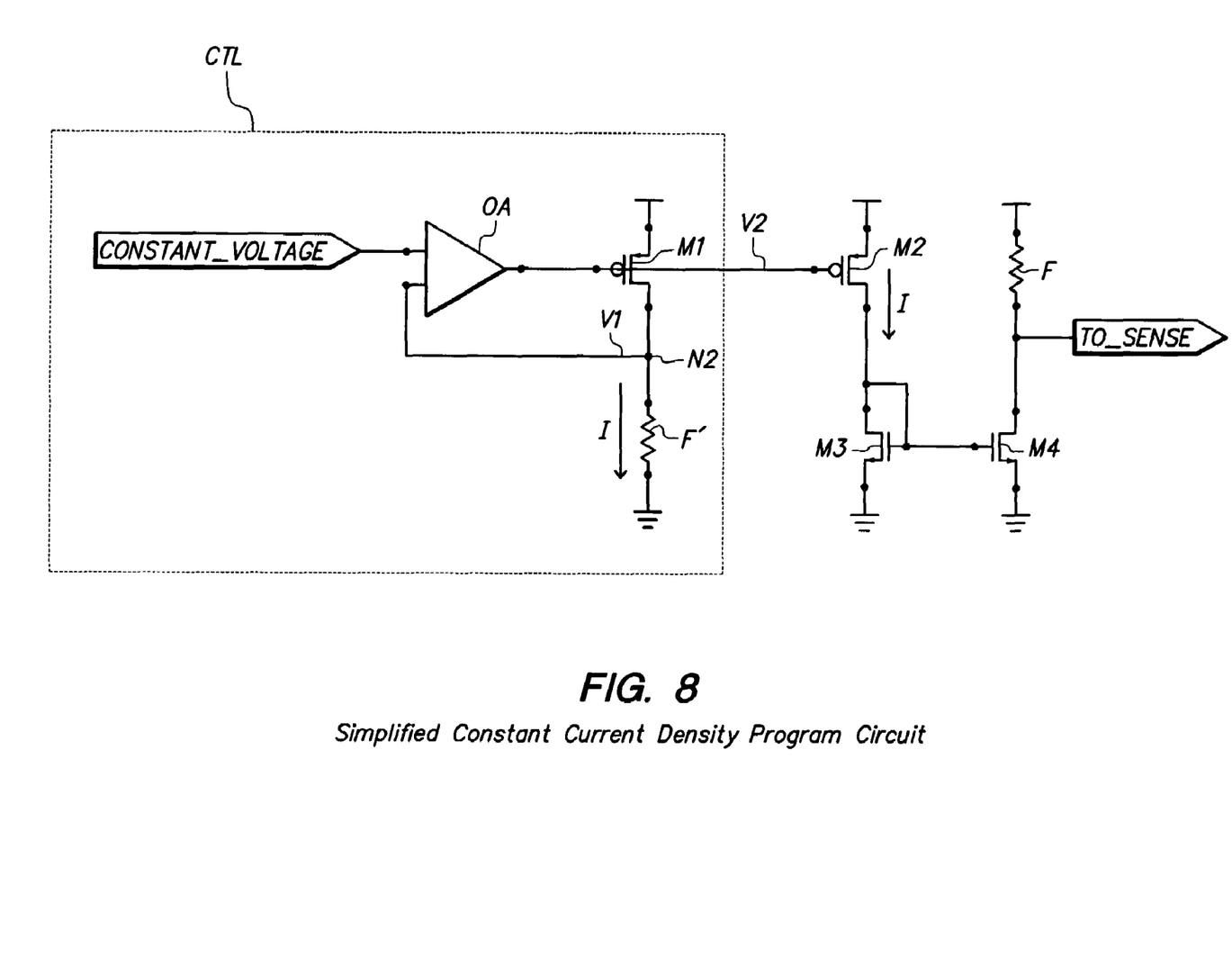
FIG. 8 is a diagram of a simplified constant current density programming circuit.

If the resistor characteristics track with the fuse, the constant current source becomes a constant current density source. By using a fuse, or the same fuse material and width as a fuse, a constant density current source is created. The resulting simplified fusing circuit is shown in FIG. 8. As compared to the circuit of FIG. 6(C), the current source 12 is replaced by a transistor M2 controlled by a voltage signal V2 produced by a control circuit CTL. The control circuit uses a reference fuse F' that is subject to the same process variations as the fuse F. A transistor M1 is connected to the supply voltage VDD and is connected through the reference fuse F' to ground. The voltage signal V2 is connected to the gate of the transistor M1 to control the flow of current through it. The voltage signal V2 is produced by an operational amplifier OA. One input of the operational amplifier OA is connected to a constant voltage. The other input is connected to a circuit node N2 between the transistor M1 and the reference fuse F'. In operation, the operational amplifier OA causes a current I to flow through the transistor M1 and the reference fuse F, the current being of a magnitude to produce a voltage V1 at the circuit node N2 that is equal to the constant voltage applied to the operational amplifier. Because the transistors M1 and M2 are commonly controlled, the same current I is caused to flow through the transistor M2 and M3 (M3 being part of a current mirror with the transistor M4).

Figure 9:
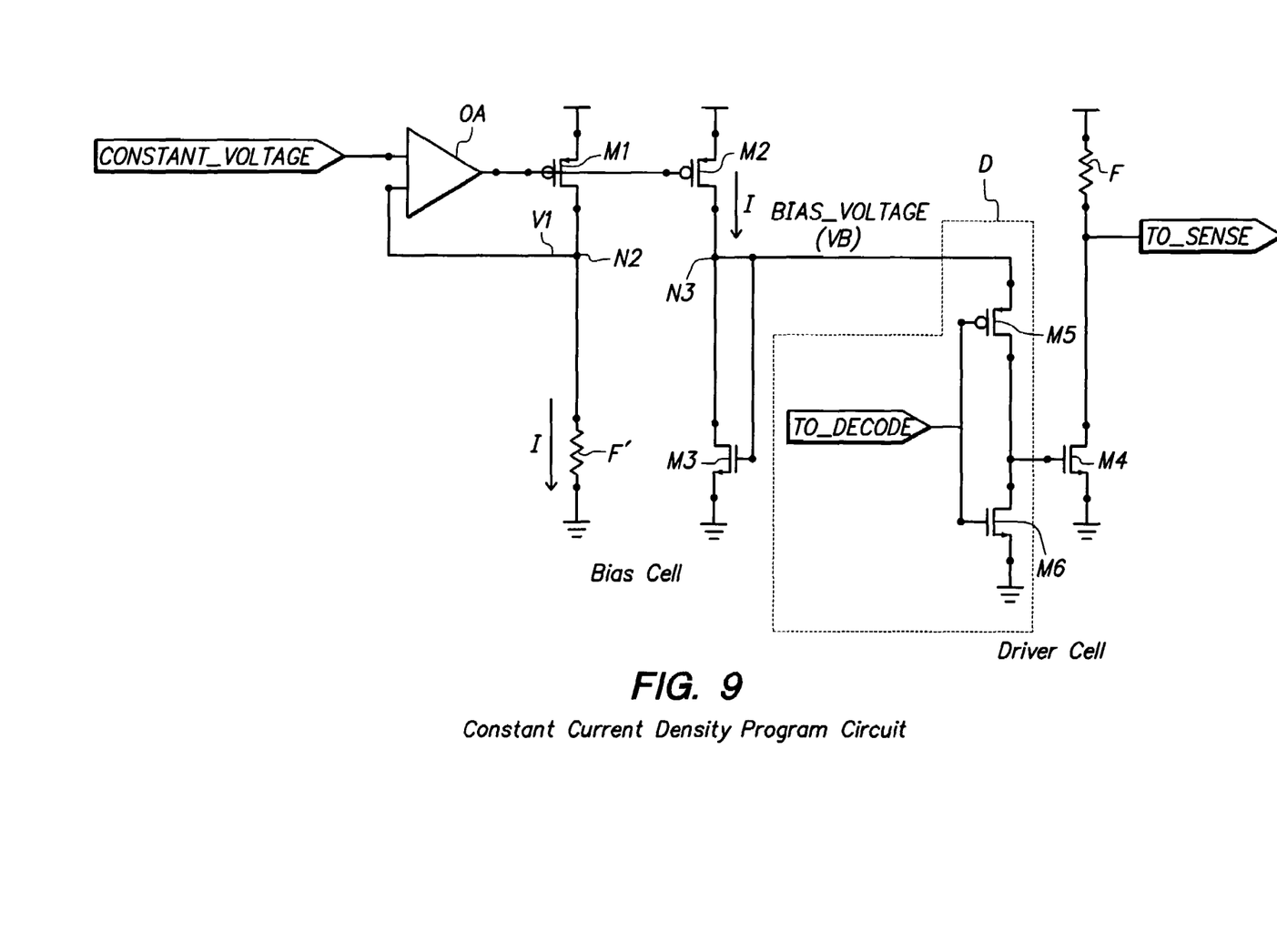
FIG. 9 is a diagram of a preferred embodiment of a constant current density programming circuit.

The complete fusing circuit is shown in FIG. 9. As compared to the circuit of FIG. 8, in the circuit of FIG. 9, a decode circuit D is interposed between a bias voltage created at a circuit node N3 and the gate electrode of the transistor M4. To form the decode circuit D, a PMOS transistor M5 connected to the bias voltage VB is connected through an NMOS transistor M6 to ground. Drain electrodes of the transistors M5 and M6 are connected to the gate electrode of the transistor M4. Gate electrodes of the transistors M5 and M6 are both connected to a control signal, TO_DECODE. When this signal is asserted, the bias voltage VB is applied to the gate of the transistor M4, causing it to conduct a fusing current. When this signal is de-asserted, a ground potential is connected to the gate of the transistors M4, preventing it from conducting. The constant voltage applied to the operational amplifier OA is supplied by a bandgap voltage circuit. A resistance created from the fuse material and having the same cross sectional area as the fuse is placed across this voltage, and a resulting current I is mirrored through transistor M2 to the reference transistor M3. The bias voltage created at the circuit node N3 by the current I is mirrored out to the fusing driver M4 when the "TO_DECODE" signal is pulled low.

Since the reference fuse is created from the same material as the fuse, and has the same dimensions, any physical variation due to process variation or temperature in the fuse is duplicated by the reference fuse. As an example, if a 0.15 u fuse width is under etched by 10%, its width will increase to 0.165 u. If constant current density is required for optimum yield, this implies that a 10% increase in fusing current is required. Since the reference fuse is under etched by the same amount, and it has a constant voltage across it, the current through it will increase by 10%, thereby creating a constant current density current I.

The bias voltage is actually the gate node of a simple diode-connected current mirror created by transistors M3 and M4. As long as the gate node voltage has enough operating margin from VDD, which can by determined by the device widths of M1-M4, the fusing current will be independent of VDD, transistor characteristics, and temperature (with the exception of the temperature coefficient of the replica fuse), and as a consequence, will give a constant, optimum, fusing current density independent of those parameters.

The reference current, I, must be significantly lower than the actual fusing current, in order not to program it. To that end, there must be a multiplication of current either at M1/M2, M3/M4, or both. A safety margin of at least 10 to 1 is chosen and is implemented in the ratio of M3 to M4.

It will be appreciated by those of ordinary skill in the art that the invention can be embodied in other specific forms without departing from the spirit or essential character thereof. The disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of programming a fusible link memory element, comprising:
    using a replica of said fusible link memory element, establishing a programming current for producing a known current density in the fusible link memory element in spite of variations including at least one of process, voltage and temperature variations; and
    applying said programming current to the fusible link memory element.

2. The method of claim 1, comprising:
producing a constant voltage; and
applying the constant voltage across the replica of said fusible link memory element to produce a reference current.

3. The method of claim 2, comprising:
mirroring said reference current to produce said programming current, the programming current and the reference current being ratioed such that the programming current is at least several times as great as the reference current.

4. A fusible link memory circuit comprising:
a fusible link memory element;
a programming circuit comprising:
    a replica of the fusible link memory element; and
    a programming current source for producing a known current density in the fusible link memory element in spite of variations including at least one of process, voltage and temperature variations.

5. The circuit of claim 4, the programming current source comprising:
    means for producing a constant voltage and applying the constant voltage across the replica of said fusible link memory element to produce a reference current.

6. The circuit of claim 5, the programming current source comprising:
    means for mirroring said reference current to produce said programming current, the programming current and the reference current being ratioed such that the programming current is at least several times as great as the reference current.

7. The circuit of claim 4, the programming current source comprising:
    a constant voltage source for producing a constant voltage, the constant voltage being applied across the replica of said fusible link memory element to produce a reference current.

8. The circuit of claim 7, the programming current source comprising:
    an operational amplifier coupled to the constant voltage source and to a voltage produced across the replica of said fusible link memory element, whereby the constant voltage is applied across the replica of said fusible link memory element.

9. The circuit of claim 7, wherein the constant voltage source comprises a bandgap voltage source.

10. The circuit of claim 7, the programming current source comprising:
    a pair of transistors connected to form a current mirror for mirroring said reference current to produce said programming current, the pair of transistors being ratioed such that the programming current is at least several times as great as the reference current.

11. The circuit of claim 10, wherein one transistor of the pair of transistors is a reference transistor, and another transistor of the pair of transistors is a driver transistor.

12. The circuit of claim 11, wherein the reference transistor and the driver transistor are matched such that at least some process variations experienced by one of the transistors are experienced proportionally by the other transistor.

13. A circuit comprising:
a first fuse;
a second fuse; and
means for using the first fuse to program the second fuse.

14. The circuit of claim 13, wherein the first fuse remains unprogrammed.

* * * * *